United States Patent
Ogura

(10) Patent No.: US 10,236,244 B2
(45) Date of Patent: Mar. 19, 2019

(54) SEMICONDUCTOR DEVICE AND PRODUCTION METHOD THEREFOR

(71) Applicant: Fuji Electric Co., Ltd., Kawasaki-shi, Kanagawa (JP)

(72) Inventor: Keisuke Ogura, Kawasaki (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 15/064,943

(22) Filed: Mar. 9, 2016

(65) Prior Publication Data

US 2016/0351487 A1     Dec. 1, 2016

(30) Foreign Application Priority Data

May 25, 2015   (JP) ................... 2015-105692

(51) Int. Cl.
| | |
|---|---|
| H01L 23/498 | (2006.01) |
| H01L 23/31 | (2006.01) |
| H01L 23/00 | (2006.01) |
| H01L 23/367 | (2006.01) |

(52) U.S. Cl.
CPC .. *H01L 23/49838* (2013.01); *H01L 23/49866* (2013.01); *H01L 24/24* (2013.01);
(Continued)

(58) Field of Classification Search
CPC ......... H01L 23/49838; H01L 23/49866; H01L 24/24; H01L 23/3135
See application file for complete search history.

(56) References Cited

U.S. PATENT DOCUMENTS

2005/0001331 A1\* 1/2005 Kojima ............... H01L 23/3121
                                                              257/778
2011/0281138 A1   11/2011 Yoshioka et al.
(Continued)

FOREIGN PATENT DOCUMENTS

| CN | 102282661 A | 12/2011 |
|---|---|---|
| CN | 105122463 A | 12/2015 |

(Continued)

OTHER PUBLICATIONS

Japanese Office Action for Application No. 2015-105692 dated Dec. 18, 2018.

(Continued)

*Primary Examiner* — Seahvosh Nikmanesh
(74) *Attorney, Agent, or Firm* — Lerner, David, Littenberg, Krumholz & Mentlik, LLP

(57) ABSTRACT

Provided is a semiconductor device having a wiring structure on a semiconductor element and capable of securing high quality and high reliability in response to the desire for high-temperature operations, a large-current specification, thinner wafers, smaller device size, and reduced loss. A semiconductor device that includes an insulating circuit board; a semiconductor element implemented on the insulating circuit board; a first insulating resin layer laminated on the insulating circuit board; a copper-plated wiring which contacts the semiconductor element via a window portion formed in the first insulating resin layer, which enables contact with the semiconductor element; and a second insulating resin layer laminated so as to seal the copper-plated wiring, and a method for producing the semiconductor device are provided.

9 Claims, 2 Drawing Sheets

(52) U.S. Cl.
CPC .............. *H01L 24/25* (2013.01); *H01L 24/82* (2013.01); *H01L 23/3135* (2013.01); *H01L 23/367* (2013.01); *H01L 2224/24226* (2013.01); *H01L 2224/2505* (2013.01); *H01L 2224/291* (2013.01); *H01L 2224/32225* (2013.01); *H01L 2224/73267* (2013.01); *H01L 2224/83447* (2013.01); *H01L 2224/92244* (2013.01); *H01L 2924/10253* (2013.01); *H01L 2924/10272* (2013.01); *H01L 2924/1203* (2013.01); *H01L 2924/12032* (2013.01); *H01L 2924/1302* (2013.01); *H01L 2924/1306* (2013.01); *H01L 2924/13055* (2013.01); *H01L 2924/13091* (2013.01); *H01L 2924/181* (2013.01)

(56) References Cited

U.S. PATENT DOCUMENTS

| | | | |
|---|---|---|---|
| 2012/0075826 A1 | 3/2012 | Kaspar et al. | |
| 2014/0034373 A1* | 2/2014 | Yoshikawa | H01F 5/003 174/260 |
| 2014/0370650 A1* | 12/2014 | Moslehi | H01L 31/18 438/98 |

FOREIGN PATENT DOCUMENTS

| | | |
|---|---|---|
| JP | H7193174 A | 7/1995 |
| JP | 2001-077488 A | 3/2001 |
| JP | 2002-231874 A | 8/2002 |
| JP | 2005039227 A | 2/2005 |
| JP | 2007251084 A | 9/2007 |
| JP | 2012523109 A | 9/2012 |
| JP | 2014032978 A | 2/2014 |
| JP | 2014-165486 A | 9/2014 |
| JP | 2015061022 A | 3/2015 |
| WO | 2010087336 A1 | 8/2010 |
| WO | 2014127067 A1 | 8/2014 |

OTHER PUBLICATIONS

Chinese Search Report for CN Application No. 201610128625.5, dated Jan. 3, 2019.

* cited by examiner

SEMICONDUCTOR DEVICE AND PRODUCTION METHOD THEREFOR

CROSS-REFERENCE TO RELATED APPLICATIONS

This application claims priority from Japanese Patent Application No. 2015-105692 filed on May 25, 2015, the disclosure of which is hereby incorporated herein by reference.

BACKGROUND ART

For wiring on device chips of power modules, conventional structures such as an aluminum wire structure and a copper wire structure or a lead frame structure in which a copper plate is bonded by using solder or a metal nanoparticle sintered compact and the like are known.

Recently, it is desired that semiconductor devices operate at high temperatures, and thus, copper materials with excellent fatigue strength have been anticipated particularly as a wiring material. However, in a copper wire structure, it is difficult to feed large current due to its small wiring cross section, and also, a function for dissipating heat from device chips cannot be expected due to small heat capacity. In addition, in bonding copper wires, stress may be applied to device chips, and in bonding wires onto thin chips used to reduce device loss, the device chips may thus crack.

On the other hand, in a lead frame structure which uses a Cu plate for wiring, by using a thick plate, paths for large currents can be secured and increase in the heat capacity can be anticipated. Bonding materials are necessary in this structure; however, in recently required high-temperature operations, the long-term reliability of currently used soldering materials is not sufficient. In addition, nanoparticle compacts of Ag or Cu are expensive, and also, it is difficult to ensure reliability of bonding due to possibly occurring voids.

A power device module is known which is effective as a large current, high heat resistance, and high radiation wiring module (see Patent Literature 1). However, because a power device module like this uses a metal plate constituted by a material such as a Cu alloy as a lead frame material, such a power device module cannot overcome the defects of the conventional technique. In addition, in the conventional power device module, a structure in which an insulating sealing resin is arranged between metal structure layers is disclosed, however, in a structure in which an insulating sealing resin is arranged between metal structure layers only, the configuration is insufficient for protecting the devices and wiring from factors such as impact, temperature, humidity, and the like.

In addition, an electronic component device has been known in which integrated circuit (IC) chips and connection electrode parts are bonded by wire bonding with gold wires and the resulting assemblies are sealed with an insulating sealing resin (see Patent Literature 2). However, an electronic component device like this cannot reduce the stress on the chips applied concurrently in operations for wire bonding.

BRIEF SUMMARY OF THE INVENTION

Technical Problem

An object of the present invention is to provide a semiconductor device arranged on a wiring structure of a semiconductor element (chip) which solves the problems arising in the conventional technique and having a structure that secures a high quality and a high reliability in response to the desire for high-temperature operations, a large-current specification, thinner wafers, smaller device size, and reduced loss.

Solution to Problem

The inventor has conceived of configuring wiring that uses a copper material on a semiconductor element without using any bonding materials such as solders, metal nanoparticles, and the like or having to perform a wire bonding process that uses ultrasonic waves, and thus has completed the present invention.

According to an aspect of the present invention, a semiconductor device comprises an insulating circuit board; a semiconductor element implemented on the insulating circuit board; a first insulating resin layer laminated on the insulating circuit board; a copper-plated wiring which contacts the semiconductor element via a window portion formed on the first insulating resin layer which enables contact with the semiconductor element; and a second insulating resin layer laminated so as to seal the copper-plated wiring.

In the semiconductor device, it is preferable that the copper-plated wiring be in the shape of a sheet.

In the semiconductor device, it is preferable that the copper-plated wiring include a seed layer, which is a thin film layer constituted by a metal or an alloy, and a copper-plated layer laminated on the seed layer.

In the semiconductor device, it is preferable that the seed layer be a metal or an alloy constituted by one or more selected from the group consisting of Cu, Ni, Al, Ag, and Au.

In the semiconductor device, it is preferable that the first insulating resin layer and/or the second insulating resin layer be a resin constituted by one or more selected from the group consisting of polyamide resin, polyimide resin, epoxy resin, polyether ether ketone resin, and polybenzimidazole resin.

According to another aspect of the present invention, a production method of a semiconductor device includes a process of implementing a semiconductor element on an insulating circuit board; a process of laminating a first insulating resin layer on the insulating circuit board; a process of forming a copper-plated wiring which contacts the semiconductor element via a window portion formed on the first insulating resin layer which enables contact with the semiconductor element; and a process of laminating a second insulating resin layer so as to seal the copper-plated wiring.

In the semiconductor device production method, it is preferable that the process of forming the copper-plated wiring include a process of forming a seed layer that is a thin film metal or alloy layer; and a process of laminating a copper-plated wiring on the seed layer by copper plating.

In the semiconductor device production method, it is preferable that the process of forming the seed layer be performed by using a sputtering method or by nonelectrolytic plating.

In the semiconductor device production method, it is preferable that the process of forming the first insulating resin layer include a process of placing a resin film constituted by one or more selected from the group consisting of polyamide resin, polyimide resin, epoxy resin, polyether ether ketone resin on the insulating circuit board on which the semiconductor element is implemented, and polybenzimidazole resin; and a process of forming the first insulating resin layer so that the thickness on the semiconductor element is 20 μm or more by melting the resin film.

Advantageous Effects of Invention

According to the semiconductor device of the present invention, an wiring that connects the semiconductor element and the insulating circuit board is a copper-plated wiring, and thereby large currents can be applied, the long-term reliability in operations at high temperatures can be improved, and the device size can be reduced. In particular, because the copper-plated wiring can connect the semiconductor element and the copper wiring on the insulating circuit board by a short distance, and thus, it is possible to reduce the switching loss that may occur due to reduction of inductance. In addition, compared with the case of using a wire-bonded lead frame or a plate lead frame, the height of the module, i.e., the dimension in a direction normal to the board surface, can be reduced, and thereby a small-size semiconductor device can be implemented.

Further, according to the semiconductor device production method of the present invention, an wiring that connects the semiconductor element and the insulating circuit board can be produced by a plating method. In the bonding by this plating method, no stress is applied to the semiconductor element, and thus it is possible to use thinner wafers for semiconductor elements.

DESCRIPTION OF EMBODIMENTS

An embodiment of the present invention will be described below with reference to attached drawings. However, the present invention is not limited to the embodiments described below. The drawings are schematic views attached for explanation of the present invention, and the dimensions of the members that constitute the device and the relative relationship among them do not limit the present invention.

Figure 1A:
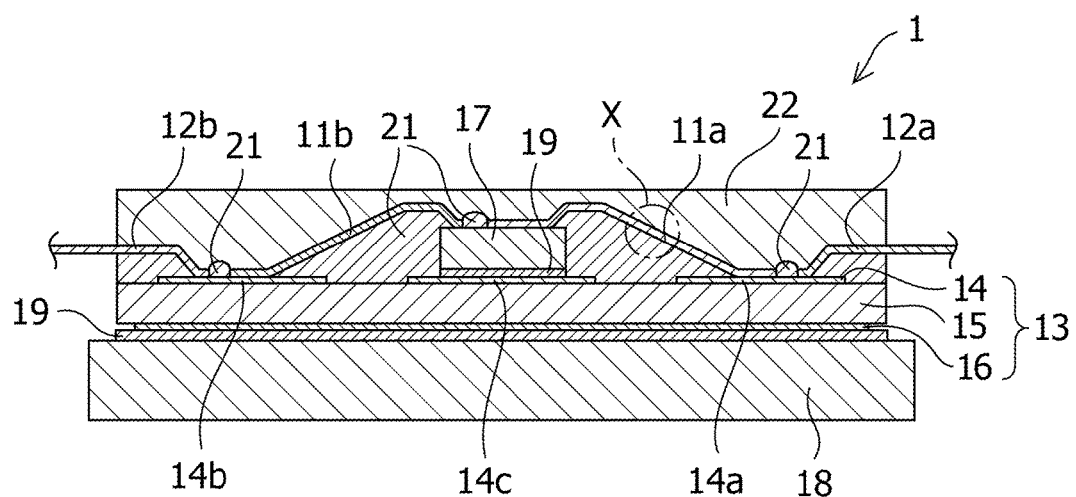
FIG. 1(a) is a schematic cross section of a semiconductor device according to an embodiment of the present invention.

According to an embodiment, the present invention relates to a semiconductor device. FIG. 1(a) is a schematic cross section of the semiconductor device according to an embodiment of the present invention. In the semiconductor device 1 illustrated in FIG. 1(a), a semiconductor element 17 is implemented on a copper wiring 14c that constitutes an insulating circuit board 13 via a bonding material 19, and copper wirings 14a, 14b, and 14c and the semiconductor element 17 are sealed with a first insulating resin layer 21. The semiconductor element 17 and the copper wirings 14a and 14b are connected by copper-plated wirings 11a and 11b, respectively. In addition, to the copper wiring 14a, 14b, an external connection terminal 12a, 12b extending to an outside of the semiconductor device 1 is bonded, respectively. Also to the copper wiring 14c, an external connection terminal 12c (see FIG. 2) is bonded. A second insulating resin layer 22 is laminated so as to seal the copper-plated wiring 11a, 11b. On the other hand, to the metal layer 16 that constitutes the insulating circuit board 13, a heat sink 18 is bonded via the bonding material 19.

On the insulating circuit board 13, the copper wiring 14 (hereinbelow, the copper wirings 14a, 14b, and 14c will be collectively referred to as the "the copper wiring 14") is arranged on one surface of an insulating layer 15, and on the other surface of the insulating layer 15, a metal layer 16 is arranged. As an example of the above-described insulating circuit board 13, a heat radiation insulating substrate produced by bonding a copper circuit to an alumina ceramic substrate by a direct copper bond (DCB) method can be used. However, the insulating circuit board 13 is not limited to a specific insulating circuit board and an insulating circuit board at least including an insulating layer and copper wirings can be used.

The configuration of the semiconductor element 17 can be determined based on the purpose of use and the specifications of the semiconductor device 1. Specifically, an insulated gate bipolar transistor (IGBT), a metal oxide semiconductor field-effect transistor (MOSFET), a field effect transistor (FET), a bipolar transistor, a gate turn-off thyristor (GTO), a Schottky barrier diode (SBD), a rectifying diode, and the like can be used, although this is not so limited. Examples of compounds that constitute the semiconductor element include, but are not limited to, silicon and SiC. In the semiconductor device 1 according to the present embodiment, a particularly thin semiconductor element that may easily crack can be used for the semiconductor element 17. For example, a semiconductor element with the thickness of 30 to 450 μm can be used. For the bonding material 19, which bonds the semiconductor element 17 to the copper wiring 14c, a general-purpose material such as a solder can be used.

The first insulating resin layer 21, which is laminated on the insulating circuit board 13, covers, insulates, and seals the copper wiring 14, the semiconductor element 17, and the bonding material 19. The first insulating resin layer 21 may be constituted by any resin generally used as a sealing resin and is preferably a resin with a chemical structure including one or more selected from the group consisting of a polyamide structure, polyimide structure, epoxy structure, polyether ether ketone structure, and polybenzimidazole structure, although this is not so limited. It is particularly preferable to use a resin constituted by one or more selected from the group consisting of polyamide resin, polyimide resin, epoxy resin, polyether ether ketone resin, and polybenzimidazole resin. It is more preferable to use a resin having a glass transition temperature of 150° C. or more.

The copper-plated wiring 11a, 11b contacts the semiconductor element 17 via a window portion, which enables contact with the semiconductor element 17 and contacts the copper wiring 14a, 14b via a window portion which enables contact with the copper wiring 14a, 14b. The term "window portion" herein refers to an exposed surface of an electrode formed by cutting and removing the first insulating resin layer 21. A portion around the exposed surface is constituted by the first insulating resin layer 21. In the semiconductor device 1 illustrated in FIG. 1(a), the copper-plated wiring 11a which electrically connects an electrode on the semiconductor element 17 to the copper wiring 14a and the copper-plated wiring 11b which electrically connects another electrode on the semiconductor element 17 with the copper wiring 14b are arranged. In the embodiment illustrated in the drawing, for both the copper-plated wiring 11a and the copper-plated wiring 11b, a protruding structure (hereinafter referred to as a "protrusion") is provided in a portion near the portion for contacting the semiconductor element 17 on an opposite side of the insulating circuit board 13, i.e., in the upper portion of FIG. 1. This is intended to prevent electric breakdown that may otherwise occur when a large current is applied due to close arrangement of an end portion of the surface of the semiconductor element 17 on which the electrode is arranged and the copper-plated wiring 11. The protrusion may be formed preferably so that the distance between a vertex of the protrusion of the copper-plated wiring 11 and the insulating circuit board 13 becomes larger than the total thickness of the thickness of the semiconductor element 17, the thickness of the copper-plated wiring 11, and the thickness of the bonding material 19 by 20 µm or more, and more preferably, by 50 µm or more. The shape and the location of the protrusion of the copper-plated wiring 11 described above can be specifically determined in accordance with the second process and the third process of the following the semiconductor device production method. By configuring the copper-plated wiring 11 as described above, the semiconductor element 17 and the copper wiring 14a, 14b can be connected by a shorter distance compared with ordinary wiring by the conventional technique while preventing electric break at the same time.

Figure 1B:
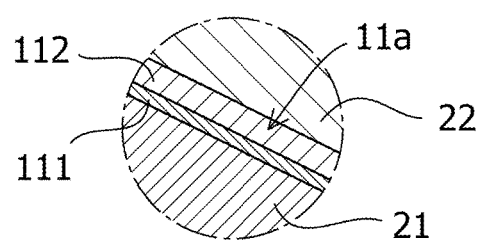
FIG. 1(b) is an enlarged drawing of the semiconductor device illustrated in FIG. 1(a) in an X portion thereof.
Figure 2:
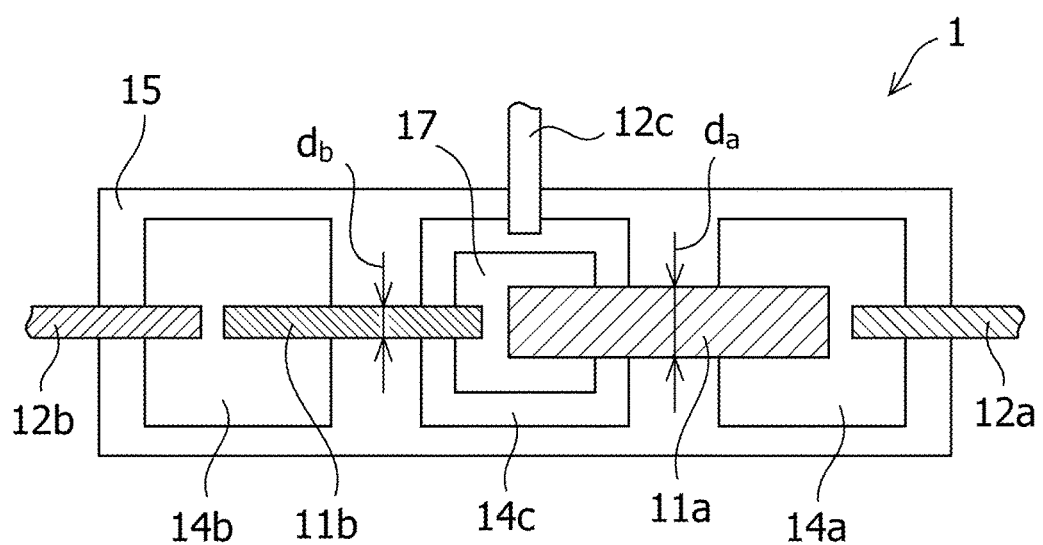
FIG. 2 is a schematic plan view of the semiconductor device illustrated in FIG. 1.

FIG. 2 is a plan view of the semiconductor device 1 illustrated in FIG. 1. However, the first insulating resin layer 21 and the second insulating resin layer 22 are omitted from the drawing for easier understanding of the positional relationship among the component members. Referring to FIG. 2, it is preferable that the copper-plated wiring 11 have a sheet-like shape. This is intended to reduce the electric resistance and enable feeding of large currents due to the large cross section obtained by the above-described configuration. Specifically, it is preferable that the copper-plated wiring 11 be sheet shaped with the thickness of 50 to 500 µm, more preferably 60 to 200 µm, for example. The thickness of the copper-plated wiring 11 can be appropriately determined by a person skilled in the art according to the function of the copper-plated wiring 11.

Next, referring to FIG. 1(b), which is an enlarged drawing of an X portion of FIG. 1(a), the copper-plated wiring 11a includes a seed layer 111, which is a thin film metal layer or a thin film alloy layer, and a copper-plated layer 112, which is laminated on the seed layer 111 by copper plating. It is preferable that the seed layer 111 be a metal or an alloy constituted by one or more selected from the group consisting of Cu, Ni, Al, Ag, and Au. It is preferable that the copper-plated layer 112 be constituted by copper alone or an alloy including copper. If a copper alloy is used, it is preferable that the copper alloy be an alloy constituted by copper and one or more metals selected from the group consisting of gold, silver, tin, nickel, and phosphorus. Examples of a preferable combination of the material of the seed layer 111 and the copper-plated layer 112 includes, but is not limited to, a combination of copper and copper, and a combination of nickel and copper. Although not shown in the drawing, the copper-plated wiring 11b also can include the same layer configuration.

It is preferable that the thickness of the seed layer 111 be even generally for the entire copper-plated wiring 11a. For example, the thickness of the seed layer 111 may be 0.1 to 5 µm, more preferably 0.5 to 2 µm. If the seed layer 111 is too thin, microscopic defects may occur in the plating, thus power cannot be evenly applied in the electrolytic copper plating process carried out in forming the copper-plated wiring 11a, and as a result, the copper-plated wiring 11a may be unevenly plated. In contrast, if the seed layer 111 is too thick, large stress may remain on the seed layer 111 and thus the seed layer may be peeled off. In addition, time taken for forming the seed layer may become long. It is preferable that the thickness of the copper-plated layer 112 be generally even for the entire copper-plated wiring 11a. Specifically, the thickness of the copper-plated layer 112 may be 50 to 500 µm, preferably 60 to 200 µm, for example. If the copper-plated wiring 11a is too thin, necessary current cannot be applied in some cases. In contrast, if the copper-plated wiring 11a is too thick, large stress may remain on the copper-plated wiring and may cause peeled layer. Also in some cases, the process time may become long.

The copper-plated wiring 11 preferably includes the seed layer 111 and the copper-plated layer 112 and does not include a copper plate or a copper wire. This is intended to prevent stress from being applied to the semiconductor element 17 in bonding of the copper-plated wiring 11 to the semiconductor element 17 if a copper plate or a copper wire is used as a substitute for the copper-plated wiring 11.

The semiconductor device 1 illustrated in FIGS. 1 and 2 includes the copper-plated wiring 11a which connects the semiconductor element 17 and the copper wiring 14a, which controls ON/OFF of the current flowing between the electrodes, and the copper-plated wiring 11b which connects the semiconductor element 17 and the copper wiring 14b, which functions as a power feeding electrode. A width da of the copper-plated wiring 11a is preferably wider than a width db of the copper-plated wiring 11b. This is because a current applied through the copper-plated wiring 11a may be larger than the current applied through the copper-plated wiring 11b. However, the width da of the copper-plated wiring 11a and the width db of the copper-plated wiring 11b may be either the same as each other or different from each other in accordance with the configuration of the embodiment. Specifically, the widths can be appropriately determined by a person skilled in the art according to the size of the semiconductor chip, the amount of current to be applied, and other specifications, and are not limited to the configuration illustrated in the drawing. In addition, although not shown in the drawing, the semiconductor device according to the present invention is not limited to the configuration in which two copper-plated wirings such as the copper-plated wirings 11a and 11b are arranged. In other words, if an element such as a diode is used, a configuration can be included in which only one wiring may be arranged in an upper portion of the element.

Referring to FIG. 1 again, the second insulating resin layer 22 is laminated on members on the insulating circuit board 13 so as to cover (seal) the copper-plated wiring 11a, 11b. FIG. 1 is a cross section of the device showing the portion in which the copper-plated wirings 11a, 11b are arranged. In the portion in which the copper-plated wirings 11a, 11b are not arranged, the second insulating resin layer 22 basically contacts the first insulating resin layer 21 and is laminated on the first insulating resin layer 21. The second insulating resin layer 22 can be selected from the same resin as described above for the first insulating resin layer 21. The second insulating resin layer 22 and the first insulating resin layer 21 can be constituted by the same resin or different resins. The second insulating resin layer 22 may be formed so as to have a thickness with which it can cover, insulate, and seal the semiconductor element 17, the copper-plated wirings 11a and 11b and external connection terminals 12a, 12b, and 12c. This thickness can be appropriately determined by a person skilled in the art.

The external connection terminals 12a, 12b, and 12c are electrically connected to the copper wirings 14a, 14b, and 14c that constitute the insulating circuit board 13, respectively. The external connection terminal 12 may be constituted by a copper plate or a copper alloy plate. One end of the external connection terminal 12 is bonded to the copper wiring 14 by a solder or other bonding materials. The external connection terminal 12 may be sealed by the first insulating resin layer 21, or optionally by the first insulating resin layer 21 and the second insulating resin layer 22. The other end of the external connection terminal 12 extends from the semiconductor device 1 outward, which enables electrical connection with an outside of the device.

The heat sink 18 can be arranged in the metal layer 16, which constitutes the insulating circuit board 13, via the bonding material 19. The heat sink 18 may be a copper plate or an aluminum fin, and the shape of the heat sink 18 is not limited to the shape shown in the drawing.

In the semiconductor device having the above-described configuration, large currents can be applied due to the copper-plated wirings and the semiconductor element can be made thin. Accordingly, the size of the device can be designed smaller compared with the conventional technique. For example, the area of the insulating circuit board can be reduced to about 70 to 90% of that of the conventional device. In addition, the height of the semiconductor device can be reduced to 40 to 70% of the conventional device.

Next, the present invention will be described from the viewpoint of the method of producing the semiconductor device. The semiconductor device production method according to an embodiment of the present invention includes a first process of implementing the semiconductor element to the insulating circuit board; a second process of laminating the first insulating resin layer on the insulating circuit board; a third process of forming a copper-plated wiring which contacts the semiconductor element via a window portion which enables contact with the semiconductor element; and a fourth process of laminating the second insulating resin layer so as to seal the copper-plated wiring. The semiconductor device production method according to the present embodiment will be described below with reference to FIGS. 1 and 2 again.

In the first process of implementing the semiconductor element 17 on the insulating circuit board 13, the insulating circuit board 13 constituted by the insulating layer 15 which includes the copper wiring 14 on one surface thereof and the metal layer 16 on the other surface thereof is prepared, and the semiconductor element 17 is implemented on the copper wiring 14c (a die pad portion) by using the bonding material 19 such as a solder. The above-described process can be implemented by a technique usually used in general semiconductor device production methods.

In the second process of laminating the first insulating resin layer 21 on the insulating circuit board 13, the first insulating resin layer 21 is laminated on the surface of the insulating circuit board 13 obtained in the first process, on which the semiconductor element 17 has been implemented, on the side of the copper wiring 14. To form the first insulating resin layer 21, optionally one sheet or more laminated sheets of a resin film constituted by a resin preferably including one or more selected from the group consisting of polyimide resin, epoxy resin, polyether ether ketone resin, and polybenzimidazole resin can be placed on the insulating circuit board 13 where necessary. In a more preferred embodiment, in the second process, a resin film is placed on the semiconductor element 17 so that a first insulating resin layer with the thickness of 20 µm or more, more preferably 50 µm or more, is formed. This is intended to prevent electric break that may occur due to concentration of current in the protrusion of the copper-plated wiring 11 formed in the subsequent process when the semiconductor device 1 is used. The thickness of a portion of the first insulating resin layer 21 in which the semiconductor element 17 is not implemented is not particularly limited, and the thickness can be appropriately determined by a person skilled in the art so that the copper wiring 14 can be sealed and the plated wiring formed in the next process can be arranged in a portion with a desired distance from the insulating circuit board 13. For example, the first insulating resin layer 21 can be formed to the same height of the first insulating resin layer 21 on the semiconductor element 17 for the entire surface of the insulating circuit board 13. In an alternative configuration, the first insulating resin layer 21 may be formed so that the thickness thereof in a portion near the semiconductor element 17 becomes thick and so that the thickness thereof becomes thinner toward the peripheral portion of the insulating circuit board 13.

For a specific operation method performed for forming the first insulating resin layer 21, for example, a frame such as a plastic frame that surrounds the periphery of the insulating circuit board 13 is installed, and a necessary number of resin films are laminated and placed on the insulating circuit board 13. Then the resin films are heated to a predetermined temperature determined according to the type of the resin to melt the resin film. The resin film can be cured on the insulating circuit board 13 by thermal pressure welding so that it may be closely attached. Note that the above-described values of 20 µm or more and 50 µm or more refer to the thickness of the first insulating resin layer 21 after it is heated and cured. By performing the operation described above, the copper wiring 14 on the insulating layer 15 and the semiconductor element 17 can be brought into contact with the first insulating resin layer and can be insulated and sealed by the first insulating resin layer 21.

The second process is not limited to the operation that uses the resin film. Specifically, the second process can be implemented by a method in which a resin fluidized at a predetermined temperature is applied into the insulating circuit board 13 surrounded by a frame and cured by heating therein. In this configuration, it is preferable to implement the second process so that the first insulating resin layer 21 having the above-described predetermined thickness or thicker is laminated on the semiconductor element 17.

Then, in the third process of forming the copper-plated wiring 11 which contacts the semiconductor element 17 via the window portion which enables contact with the semiconductor element 17, the window portion is formed in the first insulating resin layer 21 and the copper-plated wiring 11 is formed. With respect to the window portion, in the embodiment illustrated in the drawing, one window portion is arranged to each of the two electrodes located on the surface of the semiconductor element 17 opposite to the bonding material 19, one window portion is arranged on the copper wiring (electrode) 14b which has a function of a power feeding electrode, and one window portion is arranged on the copper wiring (electrode) 14a which has a function of controlling ON/OFF of the current applied between the electrodes. Specifically, the window portion can be implemented by cutting to remove the first insulating resin layer 21 which covers a desired electrode with a laser, for example. By performing the operation described above, the window portion in which the electrode surface is exposed and which enables electrical connection with the copper-plated wiring 11 can be formed. The size of the window portion can be appropriately determined by a person skilled in the art in accordance with the amount of necessary current.

More specifically, the copper-plated wiring 11 can be formed by performing a method including a process of forming the seed layer 111; a process of forming a mask in a portion other than a portion including the wirings; a process of forming the thick copper-plated layer 112; and a process of removing the mask and the seed layer. In the process of forming the seed layer 111, a metal layer of an alloy layer constituted by one or more selected from the group consisting of Cu, Ni, Al, Ag, and Au is formed on the entire surface of the members on the insulating circuit board 13 including the first insulating resin layer 21 and the window portion by a sputtering method or an nonelectrolytic plating method. The thickness of the layer is as described above in the embodiment of the semiconductor device 1 as an example. In the process of forming the mask in the portion other than the portion in which the copper-plated wiring 11 is arranged, the mask is formed on a portion of the first insulating resin layer 21 and the window portion in which the copper-plated wiring 11 is not formed. For the mask, a resin mask can be appropriately used, and the mask can be formed by generally used mask forming methods. By adjusting the portion (area) for forming the mask in this process, the width of the copper-plated wiring 11 can be determined. For example, as illustrated in FIG. 2, the width da of the copper-plated wiring 11a and the width db of the copper-plated wiring 11b can be easily assigned with mutually different values by performing this process.

In the subsequent process of forming the thick copper-plated layer 112, a thick plated layer is formed by electrolytic copper plating. The composition of the plating bath and the plating conditions may be those used in general electrolytic copper plating, and can be appropriately determined by a person skilled in the art. For example, to form a plated layer plated with copper alone and having a thickness of about 60 to 80 µm, the current density may be 1 to 15 A/dm2.

In the process of removing the mask and the seed layer, the mask can be removed by a method suitable for removal of the mask used. The seed layer can be removed by etching that uses an etching liquid selected according to the components of the seed layer. By performing this third process, the copper-plated wiring 11 including the seed layer 111, which is a thin film metal layer or a thin film alloy layer, and the copper-plated layer 112, which is laminated on the seed layer, can be formed at a desired location.

After the third process and before the fourth process, a process of attaching parts such as external connection terminals can be implemented as an optional process. For example, for the external connection terminal 12a, 12b, 12c illustrated in FIG. 2, the first insulating resin layer 21 is cut, thus the window portions are formed at predetermined locations of the copper wirings 14a, 14b, 14c, and the external connection terminals 12a, 12b, 12c constituted by copper plates prepared by conventional techniques can be bonded by using a solder or other bonding materials. In addition, coupling by screwing (not illustrated) can be formed.

In the fourth process of laminating the second insulating resin layer 22 so as to seal the copper-plated wiring 11, the second insulating resin layer is laminated on the members on the insulating circuit board 13 obtained by the third process or by the subsequent optional process. Generally, the second insulating resin layer 22 is laminated so as to cover the first insulating resin layer 21, which has been located on the most front surface after the removal of the mask and the seed layer therefrom, and the copper-plated wiring 11. Specifically, the fourth process can be implemented by a method including an operation in which, similarly to the second process, the insulating circuit board 13 is surrounded with a frame; a resin film is placed on the members on the insulating circuit board 13; and the resin film is heated to a predetermined temperature or a previously heated fluidized resin is applied to the insulating circuit board 13 and cured by heating. In this configuration, if a window portion formed by the optional process is arranged, for example, the second insulating resin layer 22 is also applied to the periphery of the external connection terminals 12a, 12b, 12c constituted by the window portion and the plate, which thereby enables sealing of the window portion and the external connection terminals 12a, 12b, 12c.

According to the semiconductor device production method of the present embodiment, the copper-plated wiring can be formed without using a bonding material and without using ultrasonic wave bonding, which applies stress to the chip. The above-described production method is advantageous in that specifications of the sheet-like copper-plated wiring such as the width and the thickness can be easily changed.

INDUSTRIAL APPLICABILITY

The semiconductor device according to the present invention can be preferably used as a power module for feeding large currents, and the like.

REFERENCE SIGNS LIST

1 Semiconductor device
11a, 11b Copper-plated wiring
111 Seed layer
112 Copper-plated layer
12a, 12b, 12c External connection terminal
13 Insulating circuit board
14a, 14b, 14c Copper wiring
15 Insulating layer
16 Metal layer
17 Semiconductor element (chip)
18 Heat sink
19 Bonding layer
21 First insulating resin layer
22 Second insulating resin layer.

The invention claimed is:
1. A semiconductor device comprising:
an insulating circuit board;
a semiconductor element implemented on the insulating circuit board;
a first insulating sealing resin layer laminated on the insulating circuit board and the semiconductor element such that a portion of the semiconductor element is exposed;
a copper-plated wiring which, at a first end thereof, contacts the semiconductor element via the exposed portion which enables contact with the semiconductor element; and
a second insulating sealing resin layer laminated so as to seal an interconnection between the copper-plated wiring and the semiconductor element.
2. The semiconductor device according to claim 1, wherein the copper-plated wiring has a sheet-like shape.
3. The semiconductor device according to claim 1, wherein the copper-plated wiring comprises a seed layer, which is a thin film layer constituted by a metal or an alloy, and a copper-plated layer laminated on the seed layer.
4. The semiconductor device according to claim 3, wherein the seed layer is a metal or an alloy constituted by one or more selected from the group consisting of Cu, Ni, Al, Ag, and Au.

5. The semiconductor device according to claim 1, wherein the first insulating resin layer and/or the second insulating resin layer is a resin constituted by one or more selected from the group consisting of polyamide resin, polyimide resin, epoxy resin, polyether ether ketone resin, and polybenzimidazole resin.

6. The semiconductor device according to claim 1, further comprising a copper wiring on the insulated circuit board, wherein the first insulating resin layer is laminated on the insulating circuit board and the copper wiring such that a portion of the copper wiring is exposed.

7. The semiconductor device according to claim 6, wherein the copper-plated wiring, at a second end thereof, contacts the exposed portion of the copper wiring.

8. The semiconductor device according to claim 3, wherein the seed layer is laminated on the first insulating resin layer and the second insulating resin layer is laminated on the copper-plated layer.

9. The semiconductor device according to claim 1, wherein the semiconductor element is selected from an insulated gate bipolar transistor (IGBT), a metal oxide semiconductor field-effect transistor (MOSFET), a field effect transistor (FET), a bipolar transistor, a gate turn-off thyristor (GTO), a schottky barrier diode (SBD), and a rectifying diode.

* * * * *